United States Patent [19]

Sutphin et al.

[11] Patent Number: 4,663,765
[45] Date of Patent: May 5, 1987

[54] DATA MUTING METHOD AND APPARATUS FOR AUDO-DIGITAL COMMUNICATIONS SYSTEMS

[75] Inventors: Melvin W. Sutphin, Bedford; Theodore E. Taylor, Lynchburg, both of Va.

[73] Assignee: General Electric Company, New York, N.Y.

[21] Appl. No.: 697,146

[22] Filed: Feb. 1, 1985

[51] Int. Cl.⁴ .................. H04L 25/00; H04L 27/00
[52] U.S. Cl. .......................... 375/5; 375/104; 375/114; 455/38; 455/54
[58] Field of Search ............ 375/5, 88, 104, 114, 375/82; 455/31, 33, 35, 36, 38, 51, 53, 54, 58, 212, 218, 220, 222, 224; 340/825.44, 825.5, 825.52; 377/28, 39; 179/2 E, 2 EA, 2 EB

[56] References Cited

U.S. PATENT DOCUMENTS

| | | | |
|---|---|---|---|
| 3,870,958 | 3/1975 | Rypinski et al. | 375/5 |
| 3,902,123 | 8/1975 | Oomen | 455/221 |
| 3,909,727 | 9/1975 | Hughes et al. | 375/5 |
| 3,927,376 | 12/1975 | Ferrie | 375/5 |
| 3,939,431 | 2/1976 | Cohlman | 375/88 |
| 4,020,421 | 4/1977 | Elder et al. | 375/5 |
| 4,041,393 | 8/1977 | Reed | 375/5 |
| 4,131,849 | 12/1978 | Freeburg et al. | 375/5 |
| 4,233,565 | 11/1980 | Chmura | 375/5 |
| 4,344,175 | 8/1982 | Leslie | 455/218 |
| 4,423,416 | 12/1983 | Bailey et al. | 375/5 |
| 4,424,514 | 1/1984 | Fennell et al. | 340/825.44 |
| 4,430,742 | 2/1984 | Milleker et al. | 375/5 |
| 4,450,573 | 5/1984 | Noble | 455/218 |
| 4,541,118 | 9/1985 | Eastmond et al. | 455/228 |

OTHER PUBLICATIONS

Nordic Mobile Telephone, "Technical Specification for the Mobile Ssation", 3rd Edition, Mar., 1979—pp. 1-94.

Primary Examiner—Robert L. Griffin
Assistant Examiner—Stephen Chin
Attorney, Agent, or Firm—Nixon & Vanderhye

[57] ABSTRACT

An audio muting device for use in a transceiver which receives digital data preceded by a dotting pattern uses a detection/decoder for detecting the non-audible dotting pattern and a controller for actuating a muting switch whenever the dotting pattern is detected.

14 Claims, 3 Drawing Figures

DATA MUTING METHOD AND APPARATUS FOR AUDO-DIGITAL COMMUNICATIONS SYSTEMS

FIELD OF THE INVENTION

The present invention is directed to a data muting method and apparatus for use in an audio/digital communication system. The method and apparatus of the present invention is particularly adapted for use in a transceiver of a cellular radio communication system which complies with EIA Compatability Specification IS-3B.

BACKGROUND OF THE INVENTION

Digital data transmitted in an audio/digital communication system, even when transmitted at as much as a 10 KBPS rate, has energy in the audio band (300–3,000 Hz) which cannot be filtered. Digital data transmission bursts, although not at a high volume, can thus cause audio noise which is irritating to communications system users. The transmitter of the communication system mutes the transmitted audio (or voice) when it transmits digital data and accordingly if the receiver of the communication system also mutes its audio circuitry during data transmission times, no meaningful audio signals will be lost.

U.S. Pat. Nos. 4,344,175 to Leslie; 4,020,421 to Elder et al; 3,939,431 to Cohlman; 3,927,376 to Ferrie; 3,909,727 to Hughes et al; and 3,870,958 to Rypinski et al all disclose prior art data muting methods and apparatuses. These and other prior art receiver data muting methods and apparatuses have typically included analog delay circuitry so that after the digital data has been decoded and detected, the delayed audio circuits are then muted. Since the digital data path is not delayed, the analog delay affords the circuitry enough time to decode and mute. These prior art systems are disadvantageous, however, in that they require expensive analog delay circuitry.

Some prior art systems partially decode the digital data (e.g., the synchronization word preceding actual digital data) and then mute, for example see U.S. Pat. Nos. 3,909,727 to Hughes et al, 3,939,431 to Cohlman and 4,344,175 to Leslie. However, these prior systems still allow some initial digital data noise to be heard in the audio circuits, although not to the extent as if no muting was used.

Milliker et al, U.S. Pat. No. 4,430,742 proposes to use a noise detector which responds to detection of a carrier signal so as to mute the transceiver output for a predetermined time interval. If a synchronization word of a data signal is subsequently detected by other circuitry during the relevant predetermined time interval, then the receiver output is further muted until the other circuitry detects the last bit of the following information word, at which time the transceiver output is unmuted. Such a method and apparatus has several disadvantages including the muting of the transceiver whenever the carrier signal is received, whether or not a data signal has been transmitted, and the need to provide complex additional circuitry such as a noise or tone detector, sync word detector, timer, etc.

In the prior art systems, unmuting typically occurs when the end of the digital message has been detected, after a timer times out (the timer being set in accordance with the expected length of the digital message), if the digital data is garbled, etc.

SUMMARY OF THE INVENTION

This invention also mutes the audio portion of a transceiver during digital data reception but without using expensive analog delay circuitry. The muting method and apparatus of the present invention relies upon the high frequency (i.e., above the audio band) bit rate dotting pattern which precedes each data burst (i.e., to achieve bit synchronization) as an indicator that digital data is about to be received. One dotting pattern is typically 101 bits of alternating ones (1's) and zeros (0's) and is provided to allow the demodulator of a transceiver to acquire bit synchronization. This particular dotting pattern also appears as a short 5 kHz tone burst at the receiver. Accordingly, a simple 5 kHz tone detector could be used as a digital data detector in one embodiment. It is preferable, however, to use the modem, which is typically already included in the data recovery circuitry of the transceiver, as a dotting pattern detector/decoder. A special detection program is loaded into a microprocessor controller for detecting the dotting pattern. The programmed operations compare 8-bit samples of the received signal with the predetermined expected dotting pattern. The number of pattern matches for five 8-bit samples are summed and, if at least 32 bits match the dotting pattern, then it is determined that a digital data burst is starting. Upon this determination the controller actuates a muting switch in order to mute the audio portion of the transceiver during reception of the digital data. The controller can be the one normally provided in the transceiver for other functions, such as volume control, verifying channel availability or detecting the synchronization word.

Accordingly, the method of the present invention includes detection of the preamble dotting pattern of a transceiver when the dotting pattern has been received. As mentioned above, the detection of the dotting pattern can be carried out by obtaining a number of 8-bit samples of the received signals and comparing each one of the 8-bit samples with a predetermined 8-bit dotting pattern. The dotting pattern is then determined to have been detected whenever a predetermined number of the 8-bit samples, for example 4, matches the predetermined 8-bit dotting pattern. In this way, an acceptance probability of more than 99.9% with a 0.05 bit error rate is obtained for detection of the dotting pattern and accordingly the false detection rate is extremely low.

After muting the transceiver in response to a detected dotting pattern, the controller then looks for the synchronization word following the dotting pattern. If the synchronization word is present then muting of the transceiver is maintained and operation proceeds in much the same way as in the systems described above. Thus, the transceiver is muted for a specific period of time after detection of the dotting pattern to allow the controller to look for the synchronization word. If the synchronization word is not detected within the specific time period, i.e., in the case of erroneous detection of the dotting pattern, then the transceiver is unmuted.

The above-described method and apparatus provides distinct advantages over prior art systems. First, digital data noise can be muted without degrading voice quality. Secondly, the digital data noise is completely muted without the use of expensive analog delay circuitry, because the dotting pattern appears as an initial 5 kHz tone burst which is outside the usual audio passband. Thirdly, the method and apparatus described above protects against false or unnecessary muting to a high degree. And finally, the method and apparatus disclosed mutes the entire digital data stream so that the transceiver user is not subjected to irritating noise resulting from any portion of the digital data burst.

DETAILED DESCRIPTION OF EXEMPLARY EMBODIMENTS OF THE INVENTION

Figure 1:
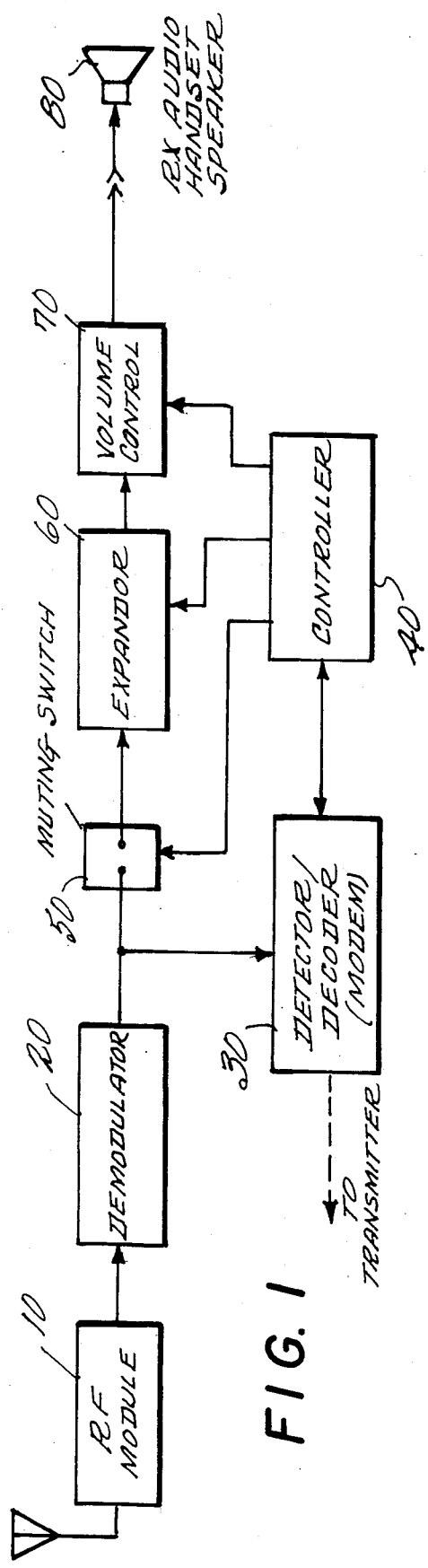
FIG. 1 schematically depicts an exemplary embodiment of the invention.

FIG. 1 shows in schematic block diagram form the receiver portion of a transceiver utilizing the present invention. The receiver includes an RF module 10 coupled to a demodulator 20. The output of demodulator 20 is passed through a muting switch 50 to an expandor 60 and is also directly input to a detector/decoder 30, which, in the preferred embodiment, includes the modem normally found in a transceiver of this type. A suitable modem is commercially available from General Electric Co., as Part No. 19B801136G1. When transceiver modem 30 is not used as the detector/decoder then a separate 5 kHz tone detector or digital decoder is required, as will be explained in greater detail below. The output from expandor 60 is passed to a volume control 70 from which it is applied to an audio output speaker, such as a handset speaker when the communication system is a cellular radio system. In the above-described transceiver, a programmable controller 40 (e.g., a microprocessor) is used to control expandor 60 and volume control 70 and is linked to modem 30. A suitable programmable controller is also commercially available from General Electric Co., as Part No. 19A703104P1.

Figure 2:
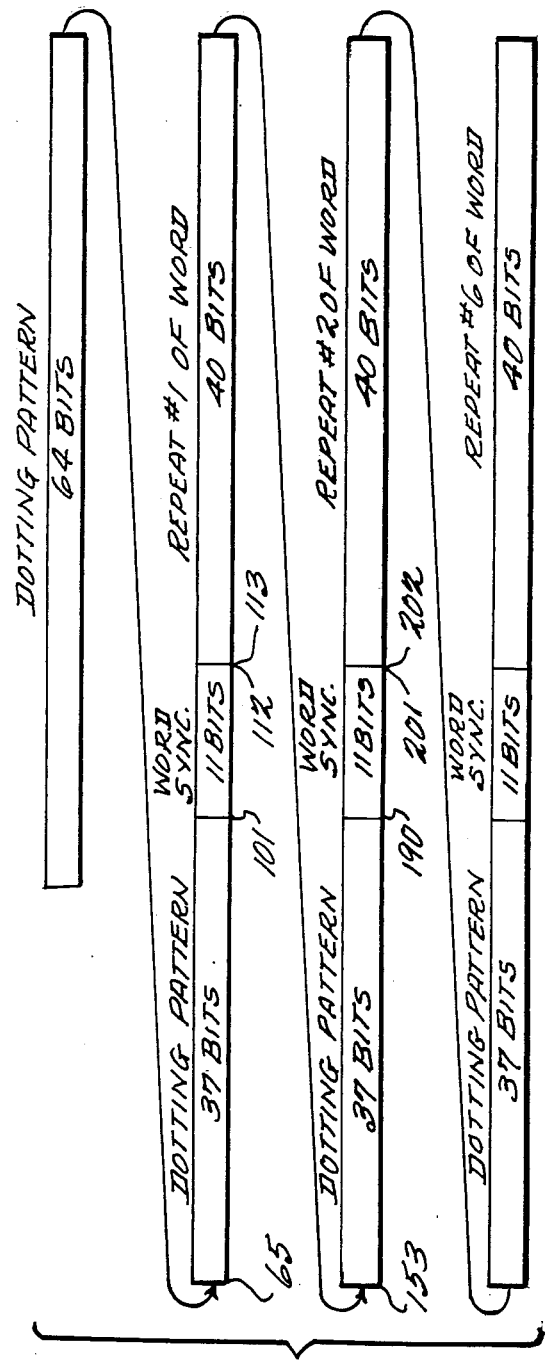
FIG. 2 illustrates the format of digital data received by the FIG. 1 exemplary embodiment of the invention.

FIG. 2 shows a typical format for digital data to be received by the transceiver of FIG. 1. As can be seen in FIG. 2, the dotting pattern comprises a first group of 64 bits and a second group of 37 bits which precede a synchronization word of 11 bits. Following the synchronization word is the digital data comprising 40 bits. Thereafter, the dotting pattern of 37 bits, the synchronization word of 11 bits and the digital data of 40 bits is repeated 10 more times in order to ensure digital data reception. Detection of word synchronization should be within the first five repeats to ensure that a message can be decoded.

In operation, modem 30 ("sampling meons") monitors the output from demodulator 20 and interrupts programmable controller 40 every 8-bit times. The programmable controller 40, in response to the interrupting signal from modem 30, tests the received bit pattern for a dotting pattern match, and, after a sufficient number of matches, actuates muting switch 50 to thereby mute the received audio portion of the transceiver.

In a preferred embodiment, the dotting pattern comprises a stream of alternating bits, i.e., 101010 . . . and early detection of the dotting pattern enables the receiver to mute the audio portion thereby preventing the user from hearing the "squawk" noise caused by the audio band components of the digital message. During reception of a signal, the transceiver unit samples the digital input circuitry for the detection of the dotting pattern. Upon determination that at least 32 bit samples match the dotting pattern, the receiver then mutes the received audio portion and looks for the synchronization word.

Figure 3:
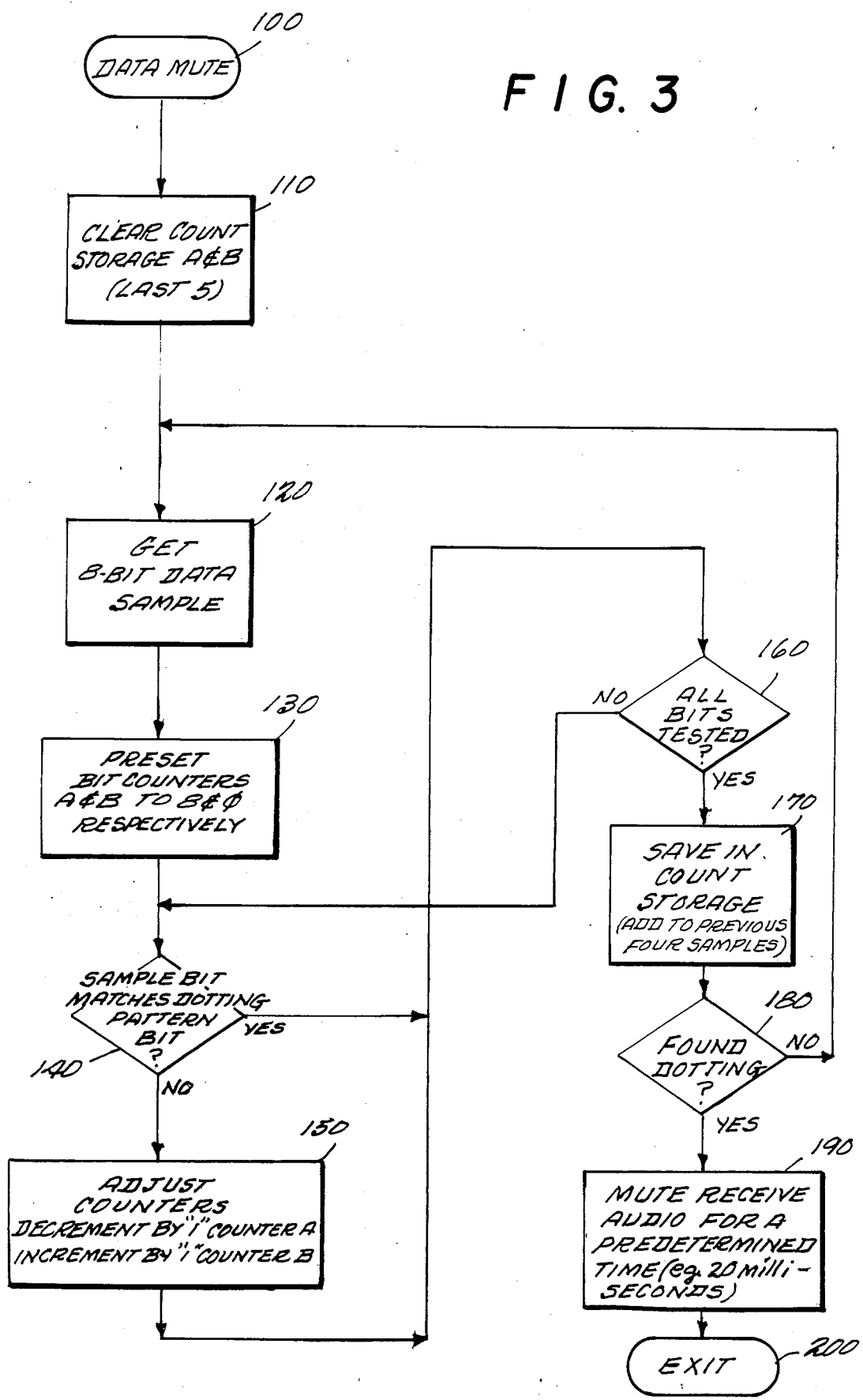
FIG. 3 illustrates a flowchart of the data muting method of the present invention.

FIG. 3 shows a flowchart of the relevant new portion of a suitable exemplary control program to be loaded into programmable controller 40 for execution so as to practice this invention. Initialization of the dotting pattern detection process takes place in step 110 upon entry into any so-called "conversation" task and after a response to a corresponding preceding digital control message, such as "hand-off" in a cellular radio system. In initialization step 110 the count storage for counters A and B is reset. In the following step 120, an 8-bit data sample is obtained from modem 30. In the succeeding step 130 the bit counters A and B are preset to 8 and zero, respectively. In the next step 140, each bit of the 8-bit data sample is matched against the corresponding bit of the dotting pattern. For example, the first bit of the 8-bit data sample is matched against the first bit of the dotting pattern. If the bits match, then no change is made to counters A and B and control proceeds to step 160, where it is determined if all eight bits of the 8-bit data sample have yet been tested. If not, then the flowchart returns to step 140 where the second bit of the 8-bit data sample is compared to the second bit of the dotting pattern, etc.

Whenever a particular bit of the 8-bit data sample does not match the corresponding dotting pattern bit, the flowchart proceeds to step 150 where the counters are adjusted. More specifically, the counter A is decremented by "1" and the counter B is incremented by "1". Thus, if the 8-bit data sample has a bit pattern of 10101010 which exactly matches the predetermined dotting pattern, then, after step 160 determines that all eight of the bits of the data sample have been tested, the counts of the counters A and B (8 and 0 respectively) are saved in count storage step 170. More particularly, the count storage step 170 maintains a running count of the counter A for the just-previous five samples and the counter B for the just-previous five samples.

The bit pattern 01010101 exactly mismatches all 8 bits of the predetermined dotting pattern since the sampling began with a leading 0 bit, and since the counter B will be incremented by 1 and the counter A will be decremented by 1 each time that the 8-bit data sample 01010101 mismatches with the predetermined dotting pattern of 10101010, the counter B will end with a value of 8 and the counter A will end with a value of 0, (i.e., after all bits have been tested as determined by step 160). Therefore, an 8-bit sample of alternating zeros and ones beginning with a "0" bit will result in the contents of counter B being 8, and this is therefore the complemented equivalent to the other possible case where contents of counter A is 8 (as will result from an 8-bit data sample of alternating ones and 0's with a beginning "1" bit). Thus whether the detection technique happens to start with a leading "0" or a leading "1" bit, if the dotting preamble is present one of the counters A, B should consistently be left with a contents of eight counts upon entry to storage step 170.

At step 180 it is determined whether the dotting pattern has been detected by determining if the accumulated running average count for either counter A or counter B (i.e., the accumulated counts for the last 5 sample times or the last 40 bits) is at least 32. If neither accumulated count exceeds 31 bits then the flowchart returns to step 120 to obtain the next 8-bit data sample and the flowchart proceeds in the same manner as has already been described above.

If in step 180 the dotting pattern is determined to have been detected (i.e., the count for counter A or B is at least 32), then the program proceeds to step 190 where the audio portion of the transceiver is muted, typically for about 20 milliseconds, and the control is passed back to other tasks at exit step 200. Thereafter the system operates in the conventional manner previously described, namely, looking for the digital synchronization word to maintain muting and then unmuting at the detected end of the digital data, if garbled data is received or if the dotting pattern has been erroneously detected (i.e., the synchronization word is not detected). After any one of the described unmuting conditions, the muting switch is returned to its normally closed position and the system awaits reinitialization by entry into another "conversation" task or after response to a digital message, as has been described above.

The flowchart shown in FIG. 3 for detecting the dotting pattern can also be exited in the same ways other more conventional controller tasks, such as verifying channel availability or detecting the synchronization word, can be exited. For example, a loss of supervisory audio tone, indicating the transceiver's loss of incoming signals, or hanging-up of the handset in a cellular radio communication system will exit the dotting pattern flowchart and return the controller to its idle state.

As mentioned previously, a separate 5 kHz tone detector can be used in place of the modem. In this configuration the detector provides an output signal to programmable controller 40 which indicates detection of the dotting pattern, i.e., the corresponding 5 kHz tone (5 KHz is above the upper audio frequency range of 3000 Hz in the preferred embodiment), and in response to this detection signal the controller actuates the muting switch 50 for a predetermined time interval in order to mute the audio portion of the transceiver.

It should be appreciated that the above-described description of the preferred embodiments do not limit the scope of the present invention in any way, and that various changes and modifications may be made without departing from the spirit and scope of the present invention.

What is claimed is:

1. A muting device for use in a transceiver in which both analog and digital signals are received and processed, wherein said digital signals are preceded by a predetermined dotting pattern of alternating binary valued signals, said device comprising:
    detecting means, connected to receive said received signal, for detecting the occurrence of said dotting pattern in said received signal and for outputting a control signal in response to said dotting pattern occurrence;
    means, connected to receive said received signal, for converting said received signal to an audio output;
    muting means, connected to receive said control signal and operatively coupled to said converting means, for muting the audio output beginning at the time said detecting means produces said control signal; and
    synchronization control means, connected to receive said received signal, for providing bit synchronization with said received signal in response to said dotting pattern,
    whereby said dotting pattern has the dual function of causing said synchronization control means to synchronize with said received signal and also causing said muting means to begin muting said audio output.

2. A device as claimed in claim 1, wherein said detecting means comprises a modem sampling N-bit segments of said received signal, and comparing means connected to said modem for comparing said sampled N-bit segments with said dotting pattern to determine whether said dotting pattern has occurred in said received signal.

3. A device as claimed in claim 2, wherein said control means includes counting means for counting the number of bit matches and the number of mismatches between said sampled N-bit segments and said dotting pattern, wherein said comparing means determines said dotting pattern has occurred when one of the number of bit matches and the number of bit mismatches exceeds a predetermined number.

4. A device as claimed in claim 3, wherein said dotting pattern comprises bits of alternating 1's and 0's with a leading 1 bit, and said counting means includes first and second counters containing first and second counts, respectively, means connected to said first counter for presetting said first count to a first predetermined value and means connected to said second counter for presetting said second count to a second predetermined value, said control means being connected to said first and second counters and incrementing said second count and decrementing said first count each time at least one bit of said sampled N-bit segment does not match said dotting pattern, said control means incrementing said second count to said first predetermined value and decrementing said first count to said second predetermined value if said N-bit samples comprise bits of alternating 0's and 1's with a leading "0" bit, wherein said control means respectively accumulates the first and second counts for a predetermined plurality of said samples, and, if the accumulated count of either of said first and second counters is at least equal to a third predetermined value, determines said dotting pattern has occurred.

5. A data muting device for use in a transceiver of the type receiving and processing both analog and digital signals, said transceiver including means for converting a received radio signal to an audio output, wherein said digital signals are preceded by a predetermined dotting pattern of alternating binary valued signals, said device comprising:
    sampling means, connected to said received signal, for periodically sampling said received signal;
    programmable control means connected to said sampling means for determining from said sampling whether a predetermined dotting pattern has occurred and for producing a muting control signal in response to said dotting pattern occurrence;
    muting means, connected to receive said programmable control means muting control signal and coupled to said converting means, for muting the transceiver audio output in response to said muting control signal beginning at the time said muting control signal is produced; and
    synchronization control means, connected to receive said received radio signal, for providing bit synchronization with said received signal in response to said dotting pattern,
    whereby said dotting pattern has the dual function of causing said synchronization control means to synchronize with said received signal and causing said muting means to begin muting said audio output.

6. A device as claimed in claim 5, wherein said sampling means comprises a modem, and said programmable control means compares N-bit segments of said received signal sampled by said modem with said dotting pattern and counts the number of bit matches and bit mismatches, said control means determining said dotting pattern has occurred when the number of bit matches or mismatches exceeds a predetermined number.

7. A data muting apparatus for use in a radio receiver which receives over one radio frequency communication channel both analog audio signals and digital signals which are preceded by a dotting preamble of alternating binary-valued digital signals occurring at a rate which is above the upper audio frequency range of about 3,000 Hertz and which produces an audio output responsive to said received audio signals, said apparatus comprising;

dotting detector means for detecting the presence of said preamble to said digital signals;

audio muting means connected to temporarily mute the receiver audio output in response to and beginning at said detection of the dotting preamble by said dotting detector means; and synchronization control means for providing bit synchronization with received digital signals in response to said dotting preamble, whereby said dotting preamble has the dual function of causing said muting means to begin muting said audio output and enabling said synchronization control means to synchronize with said received digital signals.

8. A method for muting the audio output of a radio transceiver of the type which receives analog and digital signals, said received digital signals being preceded by a predetermined dotting pattern preamble, said method comprising the steps of:

receiving a radio signal;

producing an audio output responsive to said received signal;

detecting the occurrence of said predetermined dotting pattern preamble in said received signal;

muting said audio output beginning at the time said dotting pattern preamble is detected by said detecting step; and synchronously decoding received digital signals in response to said dotting pattern preamble, whereby said dotting pattern preamble has the dual function of causing said muting step to mute said audio output and enabling said decoding step to achieve bit synchronization with said received digital signals.

9. A method as claimed in claim 8, wherein said detecting step comprises:

sampling a plurality of N-bit segments of said received signal;

comparing each of said plurality of sampled N-bit segments with a predetermined N-bit dotting pattern; and determining that said dotting pattern preamble has occurred when a predetermined number of said plurality of sampled N-bit segments match said predetermined N-bit dotting pattern.

10. A method for muting the audio output of a radio receiver of the type which receives over a radio frequency communications channel both analog audio signals and digital signals, said method comprising the steps of:

(1) receiving a radio frequency signal;

(2) producing an analog audio output signal in response to said received signal;

(3) detecting the presence within said received signal of a dotting preamble of alternating binary-valued digital signals occurring at a rate which exceeds the upper audio frequency of about 3000 Hz;

(4) temporarily muting said analog audio output signal beginning when said detecting step detects the presence of said dotting preamble; and (5) synchronously digitally decoding said received signal in response to said dotting preamble, wherein said dotting preamble has the dual function of causing said muting step to begin muting said analog output signal and permitting said decoding step to achieve bit synchronization with said received signal.

11. A method as in claim 10 wherein said muting step (4) temporarily mutes said analog output signal only when said detecting step detects the presence of said dotting preamble.

12. A method as in claim 10 wherein said detecting step includes the steps of:

(a) periodically sampling N-bit segments of said received signal;

(b) comparing said sampled segments with a predetermined alternating binary-valued pattern;

(c) counting the number of said sampled segments which mismatch said pattern bit-for-bit; and (d) determining said dotting preamble is present when the number counted by said counting step (c) exceeds a predetermined value.

13. A method for muting the audio output of a radio receiver comprising the steps of:

(1) receiving a modulated carrier signal transmitted over a communications channel;

(2) converting said received signal to an analog audio signal;

(3) applying said audio signal to an analog audio processing circuit;

(4) concurrently with said applying step (3), detecting the occurence in said received signal of a dotting preamble of alternating binary-valued digital signals occurring at a rate which exceeds 3000 Hz;

(5) only if and when said detecting step detects said preamble occurrence, temporarily inhibiting said applying step beginning at a time which is independent of the time said carrier signal is first received; and (6) synchronously digitally decoding said received signal and response to and beginning upon detection of said preamble, wherein said dotting preamble has the dual function of causing said inhibiting step to begin inhibiting said applying step, and enabling said decoding step to achieve bit synchronization with said received signal.

14. A data receiver comprising:

receiver means, connected to receive modulated carrier signals transmitted over a communications channel, for receiving said transmitted signals and for converting said signals to analog audio signals;

audio processing means, connected to receive said analog audio signals, for processing said audio signals;

means, connected to said receiver means, for detecting the occurrence in said received signals of a dotting preamble of alternating binary-valued digital signals occurring at a rate which exceeds 3000 Hz, and for temporarily inhibiting said receiver means from applying said audio signals to said audio processing means only if and when said dotting preamble occurrence is detected and beginning at a time which is independent of the time said carrier signal is first received; and synchronous digital decoding means, connected to receive said transmitted signals, for establishing bit synchronization with said received transmitted signals in response to said dotting preamble and for synchronously digitally decoding said received signals, wherein said dotting preamble has the dual function of controlling said detecting and inhibiting means to begin inhibiting said receiver means from applying said audio signals to said audio processing means, and (b) enabling said decoding means to establish said bit synchronization with said received signals.

* * * * *